United States Patent
Miller

(10) Patent No.: US 9,839,107 B2
(45) Date of Patent: Dec. 5, 2017

(54) FLOWING-FLUID X-RAY INDUCED IONIC ELECTROSTATIC DISSIPATION

(71) Applicant: Moxtek, Inc., Orem, UT (US)

(72) Inventor: Eric Miller, Provo, UT (US)

(73) Assignee: Moxtek, Inc., Orem, UT (US)

( * ) Notice: Subject to any disclaimer, the term of this patent is extended or adjusted under 35 U.S.C. 154(b) by 111 days.

(21) Appl. No.: 15/065,440

(22) Filed: Mar. 9, 2016

(65) Prior Publication Data

US 2016/0192464 A1    Jun. 30, 2016

Related U.S. Application Data

(63) Continuation-in-part of application No. 14/925,490, filed on Oct. 28, 2015, which is a continuation-in-part of application No. 14/739,712, filed on Jun. 15, 2015, and a continuation-in-part of application No. 14/920,659, filed on Oct. 22, 2015.

(60) Provisional application No. 62/028,113, filed on Jul. 23, 2014, provisional application No. 62/079,295, filed on Nov. 13, 2014, provisional application No. 62/088,918, filed on Dec. 8, 2014, provisional application No. 62/103,392, filed on Jan. 14, 2015, provisional application No. 62/142,351, filed on Apr. 2, 2015, provisional application No. 62/159,092, filed on May 8, 2015.

(51) Int. Cl.
| | |
|---|---|
| *G21K 5/08* | (2006.01) |
| *H05F 3/04* | (2006.01) |
| *H01J 9/24* | (2006.01) |
| *H05K 9/00* | (2006.01) |

(52) U.S. Cl.
CPC ............. *H05F 3/04* (2013.01); *H01J 9/241* (2013.01); *H05K 9/0066* (2013.01)

(58) Field of Classification Search
CPC ..... H05F 1/00; H05F 1/02; H05F 3/04; H05F 3/06; H01J 9/00; H01J 35/04; H01J 35/16; H05G 1/02; H05K 9/0067
USPC .................................................. 378/119–145
See application file for complete search history.

(56) References Cited

U.S. PATENT DOCUMENTS

| | | |
|---|---|---|
| 3,970,884 A | 7/1976 | Golden |
| 4,119,234 A | 10/1978 | Kotschak et al. |
| 5,469,490 A | 11/1995 | Golden et al. |
| 5,651,045 A | 7/1997 | Pouvesle et al. |
| 6,205,200 B1 | 3/2001 | Boyer et al. |
| 6,353,658 B1 | 3/2002 | Trebes et al. |
| 6,563,110 B1 | 5/2003 | Len |
| 6,570,959 B1 | 5/2003 | Kuzniar |
| 9,240,303 B2 | 1/2016 | Barnum et al. |
| 2004/0008818 A1 | 1/2004 | Rangsten et al. |
| 2005/0031083 A1 | 2/2005 | Kindlein |
| 2007/0188970 A1 * | 8/2007 | Inaba .................. B65G 49/061 361/212 |

(Continued)

FOREIGN PATENT DOCUMENTS

| | | |
|---|---|---|
| JP | 2000/267106 A | 9/2000 |
| JP | 2002/352997 A | 12/2002 |

(Continued)

*Primary Examiner* — Courtney Thomas
(74) *Attorney, Agent, or Firm* — Thorpe, North & Western, LLP

(57) ABSTRACT

A method and system for reducing static charges on a material. X-rays can ionize a flowing fluid. The ions can be transported to the material and can reduce or dissipate the static charges.

19 Claims, 4 Drawing Sheets

(56) References Cited

U.S. PATENT DOCUMENTS

| | | | |
|---|---|---|---|
| 2008/0002119 A1* | 1/2008 | Sung | G02F 1/1303 |
| | | | 349/126 |
| 2008/0110397 A1 | 5/2008 | Hyoung | |
| 2008/0278880 A1* | 11/2008 | Kisakibaru | H05F 3/06 |
| | | | 361/213 |
| 2010/0074410 A1 | 3/2010 | Ito et al. | |
| 2013/0308756 A1 | 11/2013 | Bogan et al. | |
| 2015/0092924 A1 | 4/2015 | Yun et al. | |

FOREIGN PATENT DOCUMENTS

| | | |
|---|---|---|
| JP | 2006/049390 A | 2/2006 |
| JP | 2014/514718 A | 6/2014 |
| JP | 2014/143168 A | 8/2014 |
| KR | 10-2004-0095587 A | 11/2004 |
| KR | 10-2007-0071298 A | 7/2007 |
| KR | 10-2013-0018540 A | 2/2013 |

* cited by examiner

FLOWING-FLUID X-RAY INDUCED IONIC ELECTROSTATIC DISSIPATION

CLAIM OF PRIORITY

This is a continuation-in-part of U.S. patent application Ser. No. 14/925,490, filed on Oct. 28, 2015, which:
1. is a continuation-in-part of U.S. patent application Ser. No. 14/739,712, filed on Jun. 15, 2015, which claims priority to U.S. Provisional Patent Application Nos. 62/028,113, filed on Jul. 23, 2014, and 62/079,295, filed on Nov. 13, 2014;
2. is a continuation-in-part of U.S. patent application Ser. No. 14/920,659, filed on Oct. 22, 2015, which claims priority to U.S. Provisional Patent Application Nos. 62/088,918, filed on Dec. 8, 2014, 62/103,392, filed on Jan. 14, 2015, 62/142,351, filed on Apr. 2, 2015, and 62/159,092, filed on May 8, 2015;
3. is a continuation-in-part of U.S. patent application Ser. No. 14/739,712, filed on Jun. 15, 2015, which claims priority to U.S. Provisional Patent Application Nos. 62/028,113, filed on Jul. 23, 2014, and 62/079,295, filed on Nov. 13, 2014;
4. claims priority to U.S. Provisional Patent Application Ser. Nos. 62/079,295, filed on Nov. 13, 2014, 62/088,918, filed on Dec. 8, 2014, 62/103,392, filed on Jan. 14, 2015, 62/142,351, filed on Apr. 2, 2015, and 62/159,092, filed on May 8, 2015;

all of which are hereby incorporated herein by reference in their entirety.

This claims priority to U.S. Provisional Patent Application Ser. No. 62/159,092, filed on May 8, 2015, which is hereby incorporated herein by reference in its entirety.

FIELD OF THE INVENTION

The present application is related generally to use of ions for electrostatic dissipation.

BACKGROUND

Static electric charges on various materials, such as electronic components, can discharge suddenly, resulting in damage. It can be beneficial to provide a conductive path with proper resistance level for a gradual dissipation of such charges.

SUMMARY

It has been recognized that it would be advantageous to provide a system or a method for reducing static charge without damage to sensitive components. The present invention is directed to systems and methods for reducing static charge that satisfy this need.

The system can comprise an ionization chamber including a fluid inlet port and a fluid outlet port and an x-ray source attached to the ionization chamber and capable of emitting x-rays into the ionization chamber to ionize a fluid in the chamber to create an ionized fluid.

The method can comprise flowing a fluid through an ionization chamber; emitting x-rays into the ionization chamber, the x-rays forming ions in the fluid in the ionization chamber, thus forming an ionized fluid; and emitting the ionized fluid out of the ionization chamber and onto the material, the ions in the fluid causing a reduction of the static charge on the material.

DEFINITION

As used herein, the term "flat panel display" means a sheet of glass or plastic including electronics separated into pixels for visual display, such as liquid crystal display (LCD) or organic light emitting diode (OLED).

DETAILED DESCRIPTION

Figure 1:
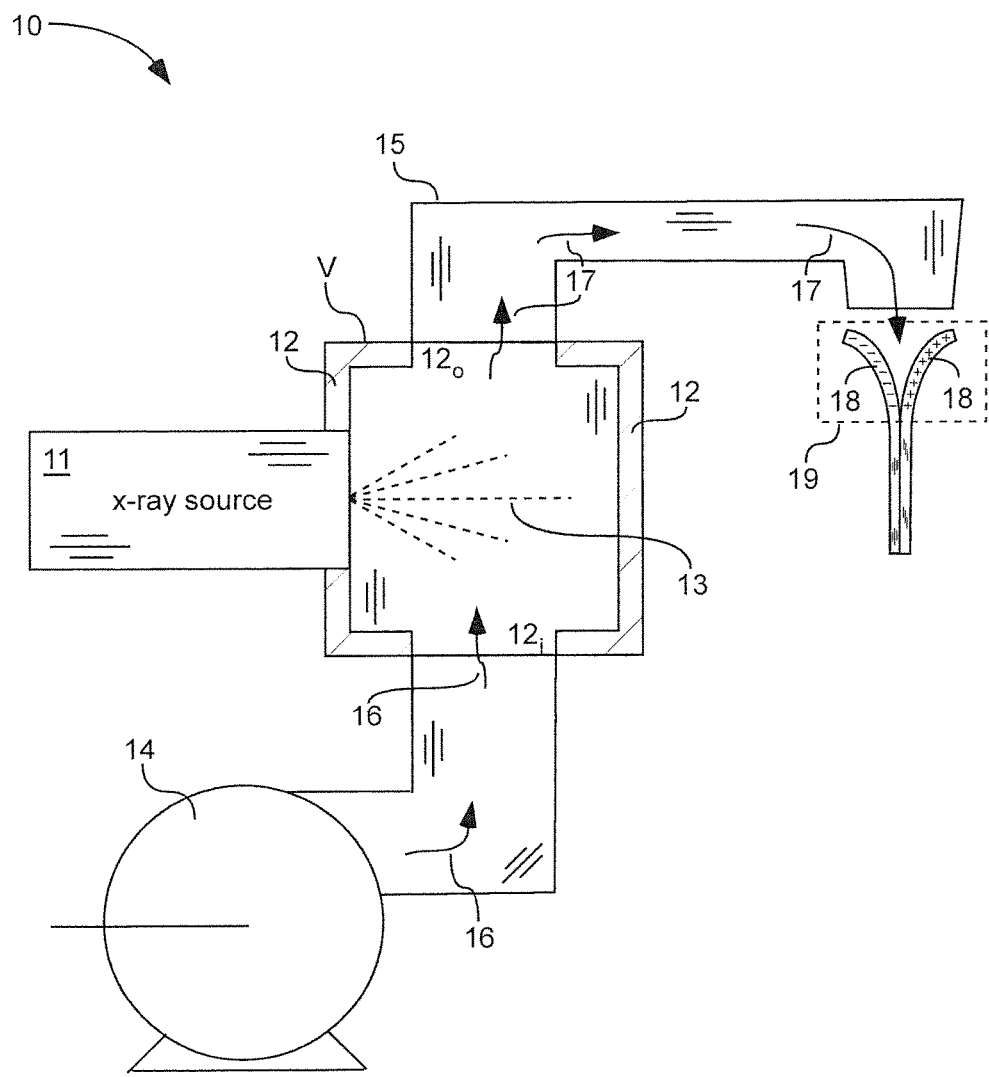
FIG. 1 is a schematic cross-sectional side view of a system or method for reducing static charge by using x-rays to ionize a flowing fluid, in accordance with an embodiment of the present invention.

As illustrated in FIG. 1, a system 10, for reducing static charge, is shown including an ionization chamber 12. An x-ray source 11 can be attached to the ionization chamber 12. The x-ray source 11 can emit x-rays 13 into the ionization chamber 12 to ionize a fluid 16 in the chamber to create an ionized fluid 17. The ionization chamber 12 can include a fluid inlet port $12_i$ and a fluid outlet port $12_o$. Fluid 16 can enter through the fluid inlet port $12_i$, become ionized by the x-rays 13, then ionized fluid 17 can exit through the fluid outlet port $12_o$.

The system 10 can include a device or means 14 for flowing fluid, or causing fluid to flow, from the inlet port $12_i$ through the ionization chamber 12 and out through the outlet port $12_o$. The device or means 14 can be pressurized gas, such as by attaching the inlet port $12_i$ to a compressed gas cylinder. The device or means 14 can be a differential pressure source, a fan, a pump, or a compressor.

The system can further comprise an electrostatic dissipation region 19. The electrostatic dissipation region 19 can include a material 18 having a static charge. The device or means 14 for flowing fluid, and an appropriate connection channel or tube 15 if needed, can direct the ionized fluid 17 out through the outlet port $12_o$ and onto the material 18. The ionized fluid 17 can dissipate built-up static charges without damage to sensitive components in the material 18. An appropriate fluid 16, flow rate of the fluid 16, energy of the x-rays 13, and x-ray flux may need to be selected for optimal static discharge of the material 18.

Figure 2:
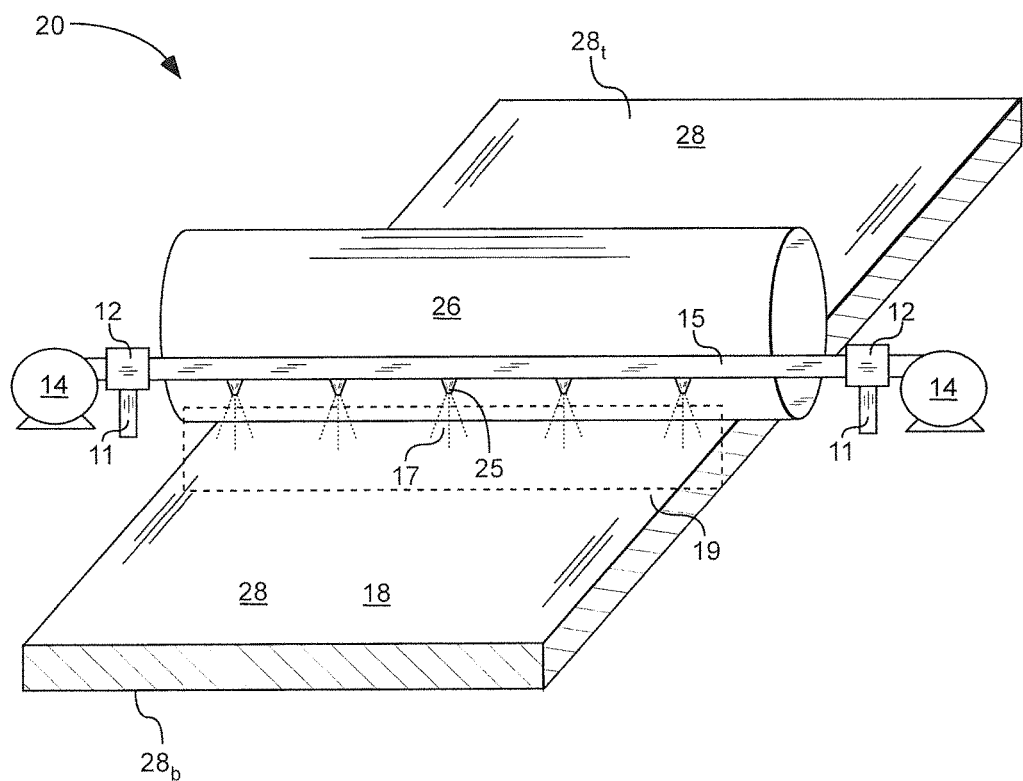
FIG. 2 is a schematic perspective view of a system or method for reducing static charge on a top side of flat panel display, in accordance with an embodiment of the present invention.

As shown in FIG. 2, system 20 for reducing static charge has a connection tube 15 with multiple openings 25 to emit the ionized fluid 17 onto the material 18. The openings 25 can be nozzles.

Figure 3:
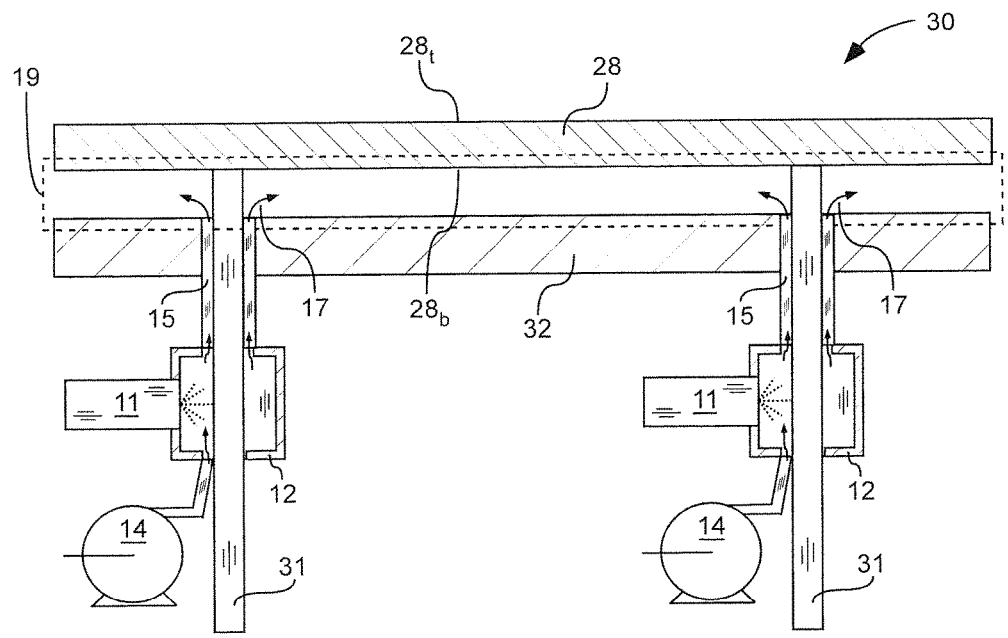
FIG. 3 is a schematic cross-sectional side view of a system or method for reducing static charge on a bottom side of flat panel display, by flowing ionized fluid around lift pins, in accordance with an embodiment of the present invention.
Figure 5:
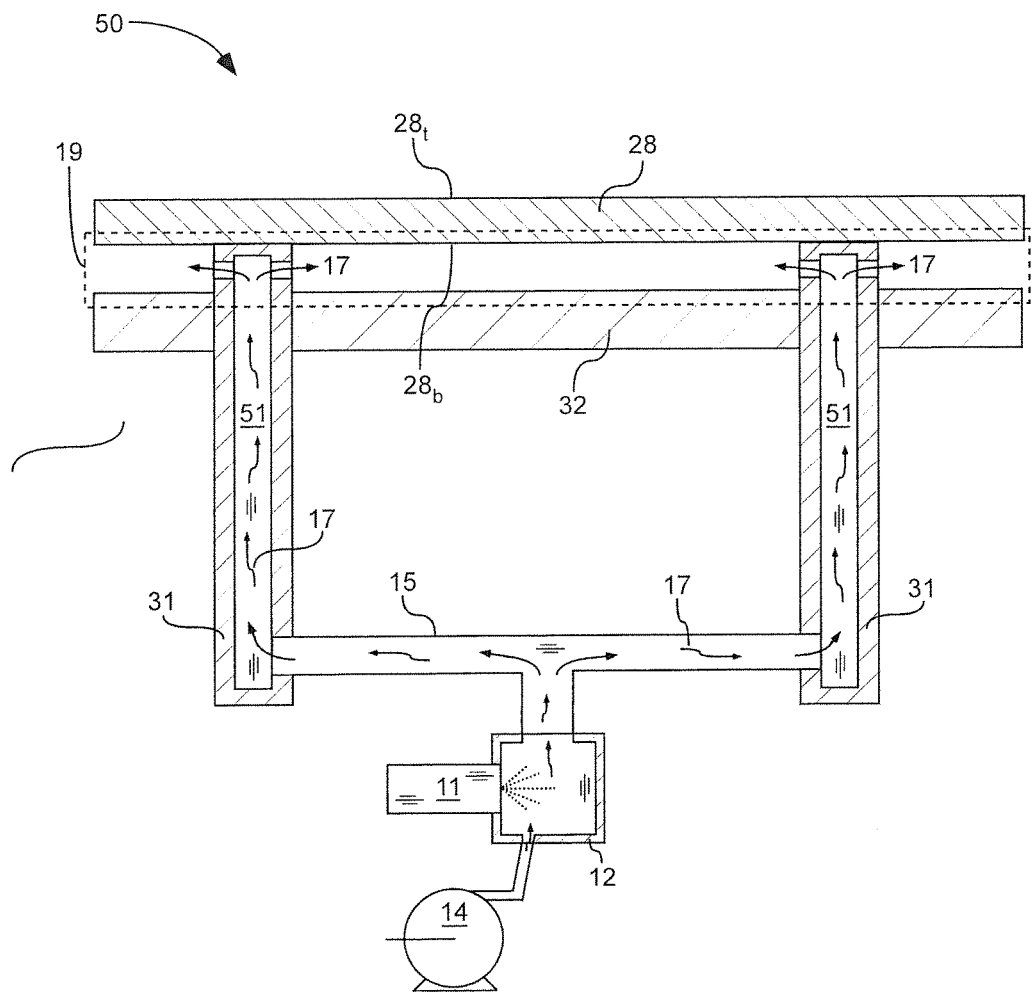
FIG. 5 is a schematic cross-sectional side view of a system or method for reducing static charge on a bottom side of flat panel display, by flowing ionized fluid through hollow channels in lift pins, in accordance with an embodiment of the present invention.

As shown in FIGS. 2, 3, and 5, systems 20, 30, and 50 for reducing static charge include a flat panel display 28 as the material 18 having the static charge. The flat panel display 28 can include a polymer. The flat panel display 28 can include liquid crystal. A rubbing machine can be used for aligning the polymer or liquid crystal.

As shown in FIG. 2, the electrostatic dissipation region 19 can include a top side 28$_t$ of the flat panel display 28 near a roller portion 26 of the rubbing machine. Although in FIG. 2, the ionized fluid 17 is shown as emitting onto the flat panel display 28 on one side of the roller 26, the ionized fluid 17 can be emitted onto the flat panel display 28 on both sides of the roller 26 (both before and after the roller 26). The fluid 16 can be ionized at one location, or as shown in FIG. 2, the fluid can be ionized at both ends of the connection tube 15 and emitted through openings 25 between both ionization chambers 12. Ionizing the fluid at both ends of the connection tube 15 and emitting through openings 25 in the center may result in more uniform static charge reduction across a width of the flat panel display 28.

As shown in FIGS. 3 & 5, on systems 30 and 50 for reducing static charge, the electrostatic dissipation region 19 can include a bottom side 28$_b$ of the flat panel display 28. As shown in FIG. 3, a lift pin 31, for lifting the flat panel display 28 off of the rubbing machine, can pass through the ionization chamber 12, though the outlet port 12$_o$, and through a connection tube 15 between the ionization chamber 12 and the electrostatic dissipation region 19. The connection tube 15 and the lift pin 31 can pass through a hole in a table 32 portion of the rubbing machine. The ionized fluid 17 can pass around an outside of the lift pin 31, within the connection tube 15, from the ionization chamber 12 to the electrostatic dissipation region 19. In order to avoid the table 32 from neutralizing ions in the ionized fluid 17, the connection tube 15 can be made of an electrically insulating material and can electrically insulate the ionized fluid 17 from metal in the table.

A potential problem of allowing the lift pin 31 to pass through the ionization chamber 12 is the lift pin 31 blocking a far side 41 of the ionization chamber 12. As shown on system for reducing static charge 40 in FIG. 4, one method for allowing ionization of fluid 16 passing on an opposite side or far side 41 of the lift pin 31 is to select material of the lift pin 31 and energy of the x-rays 13 to allow at least a certain percent of x-rays 13$_i$ impinging on the lift pin 31 to transmit through (transmitted x-rays 13$_t$) the lift pin 31 to ionize fluid 16 flowing on an opposite side 41 of the lift pin 31. For example, at least 10% of x-rays 13$_i$ impinging on the lift pin 31 can transmit through the lift pin 31 to ionize fluid flowing on an opposite side 41 of the lift pin 31 in one aspect (transmitted x-ray flux 13$_t$>0.1*impinging x-ray flux 13$_i$); or at least 30% of x-rays 13$_i$ impinging on the lift pin 31 can transmit through the lift pin 31 to ionize fluid flowing on an opposite side 41 of the lift pin 31 in another aspect (transmitted x-ray flux 13$_t$>0.3*impinging x-ray flux 13$_i$).

Figure 4:
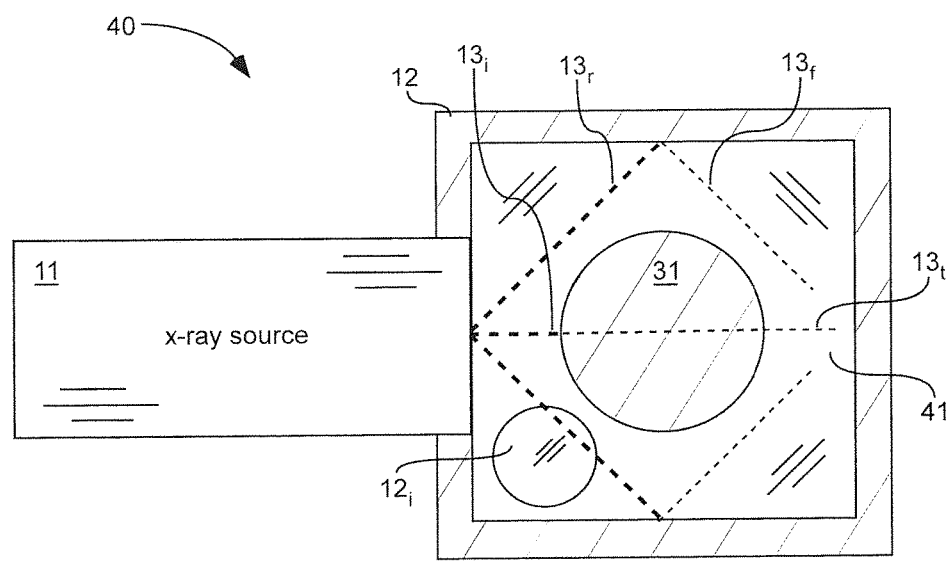
FIG. 4 is a schematic cross-sectional top view of an ionization chamber and a lift pin, in accordance with an embodiment of the present invention.

As shown on system for reducing static charge 40 in FIG. 4, another method for allowing ionization of fluid 16 passing on a far side 41 of the lift pin 31 is to select material of an inner surface of the ionization chamber 12 to fluoresces x-rays 13$_f$ in response to x-rays 13$_r$ received by this inner surface. The fluoresced x-rays 13$_f$ can reach the far side 41 of the lift pin 31 and can ionize fluid 16 flowing on this far side 41. For example, fluoresced x-ray flux 13$_f$ can be at least 30% of received x-ray flux 13$_r$ in one aspect (fluoresced x-ray flux 13$_f$>0.3*received x-ray flux 13$_r$) or fluoresced x-ray flux 13$_f$ can be at least 50% of received x-ray flux 13$_r$ in another aspect (fluoresced x-ray flux 13$_f$>0.5*received x-ray flux 13$_r$).

As shown on system for reducing static charge 50 in FIG. 5, a lift pin 31, for lifting the flat panel display 28 off of the rubbing machine, can pass through a hole in a table 32 portion of the rubbing machine. The ionized fluid 17 can pass through the outlet port 12$_o$, into a hollow channel 51 in the lift pin 31, then through the hollow channel 51 to the electrostatic dissipation region 19.

A choice of the design of FIG. 3 or the design of FIG. 5 can be made based on manufacturing considerations, cost, and whether the lift pins 31 would have sufficient strength if made hollow. One of the designs of, or both designs in FIGS. 3 & 5, can be combined with the design of FIG. 2.

In the various embodiments described herein, a fluid may be selected that can be readily ionized by x-rays, will be effective at electrostatic dissipation, and will be compatible with tools and the product manufactured. For example, nitrogen may be a good fluid to choose for electrostatic dissipation of flat panel display 28. In some applications, air may be a preferred choice.

In some applications, it may be beneficial to create ions of a single charge type (e.g. only positive ions or only negative ions). In this case, it can be beneficial to connect the ionization chamber 12 an electrical voltage V. For example, if positive ions are desired, then the ionization chamber 12 can be connected to a positive voltage source V to draw away electrons. Alternatively, if negative ions are desired, then the ionization chamber 12 can be connected to a negative voltage source V to add electrons. Thus, voltage source V can have the same polarity as desired ions in the ionized fluid 17.

A method, for reducing a static charge in a material 18, can comprise some or all of the following steps (See FIG. 1):
1. Flowing a fluid 16 through an ionization chamber 12.
2. Emitting x-rays 13 into the ionization chamber 12, the x-rays 13 forming ions in the fluid in the ionization chamber 12, thus forming an ionized fluid 17.
3. Emitting the ionized fluid 17 out of the ionization chamber 12 and onto the material 18. The ions in the fluid can cause a reduction of the static charge in the material 18.
4. Electrically connecting the ionization chamber 12 to an electrical voltage V, the electrical voltage V having the same polarity as desired ions in the ionized fluid 17.

In the above method, the material 18 can be flat panel display 28 with liquid crystal on a rubbing machine. The ionized fluid 17 can be emitted through multiple outlet holes 25 onto a top side 28$_t$ of the display 28 near a roller portion 26 of the rubbing machine. See FIG. 2.

In the above method, the material 18 can be flat panel display 28 with liquid crystal on a rubbing machine. Additional step(s) in the above method can comprise some or all of the following (See FIGS. 3-4):
5. Passing lift pins 31 through the ionization chamber 12 and through holes in a table 32 supporting the display 28;
6. Lifting the display 28 off the table 32 with the lift pins 31 while passing the ionized fluid 17 around an outer perimeter of the lift pins 31 onto a bottom side 28$_b$ of the display 28.
7. Passing the x-rays 13 through the lift pins 31 to ionize fluid 16 in the ionization chamber 12 on an opposite side of the lift pin 31 from a source 11 of the x-rays 13.
8. Fluorescing x-rays 13 from the ionization chamber 12 in response to impinging x-rays 13.

In the above method, the material 18 can be flat panel display 28 with liquid crystal on a rubbing machine. An additional step in the above method can comprise lifting the display 28 off of a table with lift pins while passing the ionized fluid 17 through hollow channels 51 in the lift pins and onto a bottom side of the display 28. See FIG. 5.

What is claimed is:

1. A system for reducing static charge, the system comprising:
    a. an ionization chamber including a fluid inlet port and a fluid outlet port;
    b. an x-ray source attached to the ionization chamber and configured to emit x-rays into the ionization chamber to ionize a fluid in the chamber to create an ionized fluid;
    c. a bottom side of a flat panel display with liquid crystal having a static charge, the system being configured to direct the ionized fluid out through the outlet port and onto the bottom side of the flat panel display;
    d. a rubbing machine for aligning the liquid crystal;
    e. a lift pin, for lifting the flat panel display off of the rubbing machine, passes through the ionization chamber, though the outlet port, and through a connection tube between the ionization chamber and the bottom side of the flat panel display;
    f. the connection tube and the lift pin pass through a hole in a table portion of the rubbing machine; and
    g. the ionized fluid passes around an outside of the lift pin, within the connection tube, from the ionization chamber to the bottom side of the flat panel display.

2. The system of claim 1, wherein material of the lift pin and energy of the x-rays are selected to allow at least 10% of x-rays impinging on the lift pin to transmit through the lift pin to ionize fluid flowing on an opposite side of the lift pin.

3. The system of claim 1, wherein material of an inner surface of the ionization chamber fluoresces x-rays in response to x-rays received by the inner surface, and the fluoresced x-ray flux is at least 30% of the received x-ray flux.

4. The system of claim 1, wherein the connection tube electrically insulates the ionized fluid from metal in the table.

5. The system of claim 1, wherein the ionization chamber is connected to an electrical voltage, the electrical voltage having the same polarity as desired ions in the ionized fluid.

6. The system of claim 1, further comprising a means for flowing fluid from the inlet port through the ionization chamber and out through the outlet port.

7. A method for reducing a static charge in a flat panel display with liquid crystal located on or in a rubbing machine, the method comprising:
    a. flowing a fluid through an ionization chamber;
    b. emitting x-rays into the ionization chamber, the x-rays forming ions in the fluid in the ionization chamber, thus forming an ionized fluid;
    c. emitting the ionized fluid out of the ionization chamber and onto the flat panel display, the ions in the fluid causing a reduction of the static charge on the flat panel display; and
    d. lifting the flat panel display off of a table with lift pins while passing the ionized fluid through hollow channels in the lift pins and onto a bottom side of the flat panel display.

8. A method for reducing a static charge in a flat panel display with liquid crystal located on or in a rubbing machine, the method comprising:
    a. flowing a fluid through an ionization chamber;
    b. emitting x-rays into the ionization chamber, the x-rays forming ions in the fluid in the ionization chamber, thus forming an ionized fluid;
    c. emitting the ionized fluid out of the ionization chamber and onto the flat panel display, the ions in the fluid causing a reduction of the static charge on the flat panel display;
    d. passing lift pins through the ionization chamber and through holes in a table supporting the flat panel display; and
    e. lifting the flat panel display off the table with lift pins while passing the ionized fluid around an outer perimeter of the lift pins onto a bottom side of the flat panel display.

9. The method of claim 8, further comprising passing some of the x-rays through the lift pins to ionize fluid in the ionization chamber on an opposite side of the lift pin from a source of the x-rays.

10. The method of claim 8, further comprising fluorescing x-rays from the ionization chamber in response to impinging x-rays.

11. The method of claim 8, further comprising electrically connecting the ionization chamber to an electrical voltage, the electrical voltage having the same polarity as desired ions in the Ionized fluid.

12. A system for reducing static charge, the system comprising:
    a. two ionization chambers, each including an x-ray source configured to emit x-rays into the ionization chamber to ionize a fluid in the chamber to create an ionized fluid;
    b. each ionization chamber located at opposite ends of a connection tube from each other; and
    c. the connection tube including an opening for emission of the ionized fluid.

13. The system of claim 12, wherein the system is configured to direct the ionized fluid onto a top side of a flat panel display.

14. The system of claim 13, wherein the system is configured to direct the ionized fluid onto the top side of the flat panel display near a roller portion of a rubbing machine.

15. The system of claim 14, wherein the system is configured to direct the ionized fluid onto the top side of the flat panel display before the roller portion of the rubbing machine.

16. The system of claim 14, wherein the system is configured to direct the ionized fluid onto the top side of the flat panel display after the roller portion of the rubbing machine.

17. The system of claim 12, wherein the opening is a nozzle.

18. The system of claim 12, wherein the connection tube further comprises multiple openings for emission of the ionized fluid.

19. The system of claim 14, wherein each of the multiple openings is a nozzle.

* * * * *